United States Patent
Hornik et al.

(10) Patent No.: US 7,199,002 B2
(45) Date of Patent: Apr. 3, 2007

(54) PROCESS FOR FABRICATION OF A FERROELECTRIC CAPACITOR

(75) Inventors: Karl Hornik, Kanagawa-ken (JP); Rainer Bruchhaus, Kanagawa-ken (JP); Nicolas Nagel, Kanagawa-ken (JP)

(73) Assignee: Infineon Technologies AG, Munich ( * ) Notice: Subject to any disclaimer, the term of this patent is extended or adjusted under 35 U.S.C. 154(b) by 0 days.

(21) Appl. No.: 10/651,614

(22) Filed: Aug. 29, 2003

(65) Prior Publication Data

US 2005/0045932 A1 Mar. 3, 2005

(51) Int. Cl.
*H01L 27/108* (2006.01)

(52) U.S. Cl. .................... 438/240; 438/3; 257/310

(58) Field of Classification Search ............ 438/3, 438/239–240, 250, 253, 393, 396; 257/306, 257/310
See application file for complete search history.

(56) References Cited

U.S. PATENT DOCUMENTS 6,139,971 A * 10/2000 Bruchhaus et al. ......... 428/446
6,300,652 B1 10/2001 Risch et al.
6,645,807 B2 * 11/2003 Tsuzumitani et al. ....... 438/243
6,660,660 B2 * 12/2003 Haukka et al. ............. 438/778
6,699,725 B2 * 3/2004 Lee ................................ 438/3
2002/0115252 A1 8/2002 Haukka et al.
2002/0197744 A1 12/2002 Lee
2003/0119273 A1 6/2003 Aggarwal et al.
2003/0129796 A1 7/2003 Bruchhaus et al.

FOREIGN PATENT DOCUMENTS

DE 101 52 636 1/2003

* cited by examiner

*Primary Examiner*—Ori Nadav
(74) *Attorney, Agent, or Firm*—Fish & Richardson P.C.

(57) ABSTRACT

A process for the fabrication of a ferroelectric capacitor comprising depositing a layer of Ti 5 over an insulating layer 3 of $Al_2O_3$, and oxidising the Ti layer to form a $TiO_2$ layer 7. Subsequently, a layer of PZT 9 is formed over the $TiO_2$ layer 7. The PZT layer 9 is subjected to an annealing step in which, due to the presence of the $TiO_2$ layer 7 it crystallises to form a layer 11 with a high degree of (111)-texture.

2 Claims, 2 Drawing Sheets

PROCESS FOR FABRICATION OF A FERROELECTRIC CAPACITOR

FIELD OF THE INVENTION

The present invention relates to fabrication processes for ferroelectric devices which include one or more ferrocapacitors, and to ferroelectric devices produced by the fabrication processes.

BACKGROUND OF THE INVENTION

U.S. Pat. No. 6,300,652B, the disclosure of which is incorporated herein by reference, describes a "vertical capacitor" structure. The capacitor includes a layer of dielectric material, typically a ferroelectric material such as PZT ($PbZr_xTi_{1-x}O_3$), deposited over barrier layer. It Is there disclosed that the barrier layer may be $TiO_2$, $Ta_2O_3$, $Si_3N_4$ or $ZrO_2$, but in other documents it is known for this layer to be $Al_2O_3$. The ferroelectric material is then patterned, opening holes which extend all the way through it and also through the barrier layer. Electrode material (such as aluminium, copper or tungsten) is deposited into the holes, so that adjacent ones of the electrodes, and the ferroelectric material between then constitute ferrocapacitors. The lower ends of the electrodes extend through the barrier layer, e.g. to further components in lower levels of the structure.

In such a structure it is of particular importance that the layer of ferroelectric material should crystallise, and furthermore that the orientation of the crystallisation should be appropriate. For example, in the case of perovskites such as PZT, a (111)-texture is preferred, i.e. that the 111-crystal direction of the PZT is perpendicular to the $Al_2O_3$ layer, so that the growth direction is in the (111)-crystal direction.

SUMMARY OF THE INVENTION

The present invention aims to provide a new and useful process for fabricating ferrocapactitors, and to provide devices including such ferrocapacitors.

In general terms, the present invention proposes that during a vertical ferroelectric capacitor fabrication process a layer of titanium oxide ($TiO_2$) is formed between a PZT layer and an insulating layer, so that the PZT layer can be formed with a high degree of crystallisation.

As a result of this process, the PZT layer may be formed with a high degree of crystallisation, particularly with a strong (111)-crystallisation.

Specifically, a first expression of the invention is a method of forming a ferroelectric capacitor in which a PZT layer is formed over an insulating layer of amorphous $Al_2O_3$ by a process including the steps of:

forming a layer of titanium oxide ($TiO_2$) over the insulating layer;

depositing a PZT layer over the $TiO_2$ layer; and performing an annealing step to crystallise the PZT layer.

The layer of $TiO_2$ is preferably formed by depositing a layer of Ti over the insulating substrate, and then oxidising the layer, such as by a heat treatment in an atmosphere containing oxygen. However, in other embodiments of the invention the $TiO_2$ layer may be formed in other ways, such as atomic layer deposition (ALD), chemical vapour deposition (CVD) or sputtering.

BRIEF DESCRIPTION OF THE FIGURES

Preferred features of the invention will now be described, for the sake of illustration only, with reference to the following figures in which.

DETAILED DESCRIPTION OF THE EMBODIMENTS

The steps of a method according to the invention are shown in FIG. 1. Referring to FIG. 1(a), a layer 3 of amorphous $Al_2O$ is formed over a layer 1 of TEOS which is regarded here as a substrate. Below the substrate 1 may be located further layers of the structure, optionally including other ferroelectric capacitors including PZT layers formed as described here.

Figure 1A:
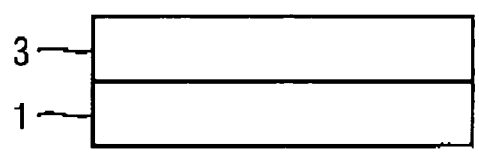
FIG. 1, which is composed of FIGS. 1(a), 1(b), 1(b c), 1(d), 1(e) and 1(f) shows a method according to the invention.
Figure 1B:
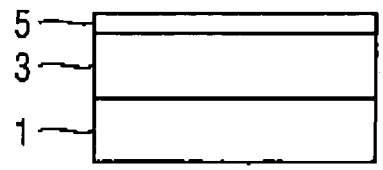
Figure 1C:
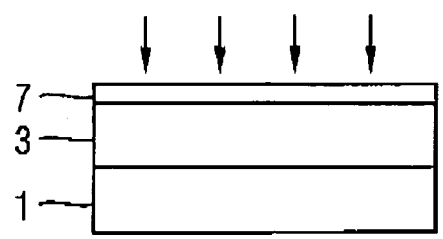

As shown in FIG. 1(b), a layer 5 of Ti of a thickness of not more than 5 nm is formed over the $Al_2O_3$ layer 3. The Ti layer is thinner than the $Al_2O_3$ layer 3. As shown in FIG. 1(c), the layer 5 is oxidised by exposing it to oxygen gas at a temperature of 650° C. using a rapid thermal annealing (RTA) step to transform it into a $TiO_2$ layer 7. The transmission of the oxygen atoms to the layer 7 is shown by vertical arrows.

Figure 1D:
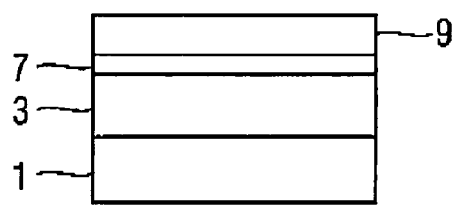

Then, as shown in FIG. 1(d) an amorphous layer 9 of PZT (for example with a ratio of Ti to Zr of by atomic proportions, although other ratios may be used within the scope of the invention) is deposited over the $TiO_2$ layer 7. The PZT layer 9 is thicker than the $TiO_2$ layer 7, and may for example be about 130 nm.

Figure 1E:
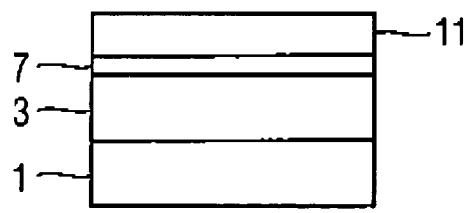
Figure 1F:
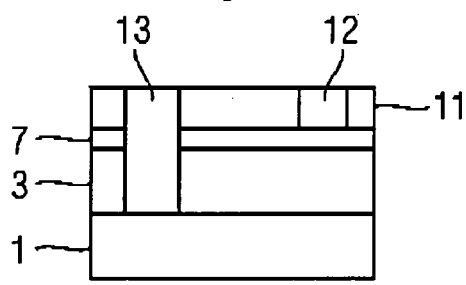

Finally, as shown in FIG. 1(e), the structure is subjected to a second RTA step, typically of duration 30 seconds (e.g. in the range of 10 second to 10 minutes) at a temperature of 650° C. (normally any temperature in the range 500 to 700° C. would be suitable). This process causes the PZT layer 9 to crystallize with a strong (111) orientation, to form a crystalline PZT layer 11.

Figure 2:
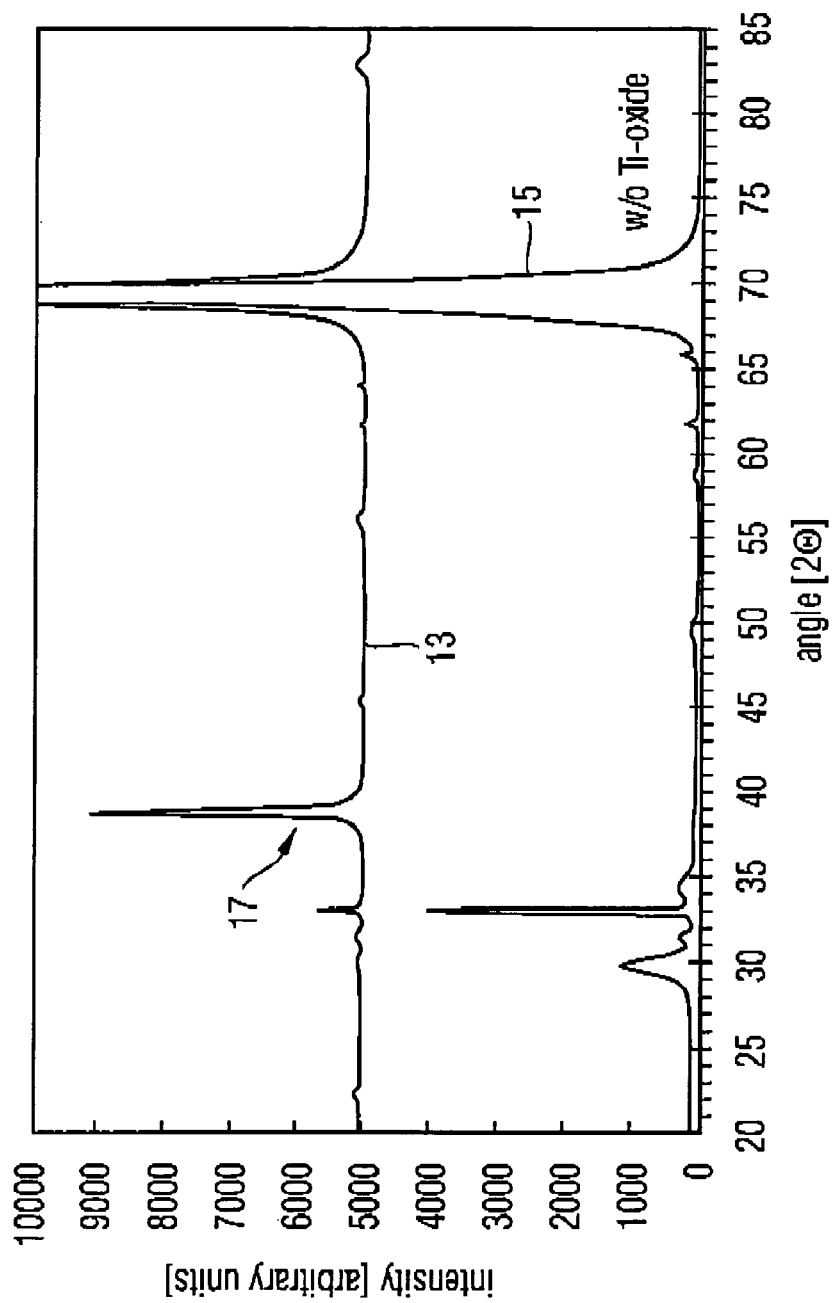
FIG. 2 is an X-ray diffraction spectrum of a known PZT layer and of a PZT layer formed using the invention.

This is illustrated in FIG. 2, which shows experimental results of X-ray diffraction profiles for two PZT layers. Intensity (in arbitrary units) is shown on the vertical axis of the figure for a range of angles illustrated on the vertical axis. Line 13 is the diffraction intensity profile for a PZT layer 9 formed by the method of FIG. 1. By contrast, line 15 is the diffraction intensity profile for a PZT layer formed by a method analogous to that of FIG. 1 but with the steps shown in FIGS. 1(b) and 1(c) omitted, i.e. with no Ti layer between the PZT layer 9 and the $Al_2O_3$ layer 3. As shown in FIG. 2, the diffraction profile 13 includes a strong peak 17 at an angle indicative of the 111-texture, whereas no corresponding peak is found in the line 15.

The process steps of FIG. 1 are used as part of the fabrication process f or an FeRAM memory device. Other steps of this method may be as in conventional methods (e.g. as in U.S. Pat. No. 6,300,652), or in methods which are proposed in the future. For example, as shown in FIG. 1F, the PZT layer may be patterned to form holes 12, 13 and electrode material deposited into the holes. The resulting electrode pairs and the PZT material between them constituting a ferrocapacitor.

Although only a single embodiment of the invention has been described, many variations are possible within the scope of the invention as will be clear to a skilled reader.

The invention claimed is:

1. A method of forming a ferroelectric capacitor in which a PZT layer is formed over an insulating layer of amorphous $Al_2O_3$ by a process including the steps of:
   forming a layer of titanium oxide $TiO_2$ over the insulating layer;
   depositing a PZT layer over the $TiO_2$ layer;
   performing an annealing step to crystallise the PZT layer;
   forming holes in the PZT layer; and
   depositing electrode material into the holes, whereby pairs of electrodes and the PZT material between them constitute ferrocapacitors.

2. A method according to claim 1 in which the $TiO_2$ layer is formed by depositing a Ti layer onto the insulating layer and then oxidising it in an atmosphere containing oxygen.

* * * * *